US012369312B2

(12) United States Patent
Zhang et al.

(10) Patent No.: US 12,369,312 B2
(45) Date of Patent: Jul. 22, 2025

(54) VERTICAL FinFet FORMATION USING DIRECTIONAL DEPOSITION

(71) Applicant: Applied Materials, Inc., Santa Clara, CA (US)

(72) Inventors: Qintao Zhang, Mt Kisco, NY (US); Sipeng Gu, Clifton Park, NY (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 17/990,206

(22) Filed: Nov. 18, 2022

(65) Prior Publication Data

US 2024/0172419 A1    May 23, 2024

(51) Int. Cl.
*H10B 12/00*    (2023.01)
*H01L 21/762*    (2006.01)

(52) U.S. Cl.
CPC .......... *H10B 12/36* (2023.02); *H01L 21/762* (2013.01); *H10B 12/056* (2023.02); *H10B 12/482* (2023.02)

(58) Field of Classification Search
CPC .... H10B 12/36; H10B 12/482; H10B 12/056; H01L 21/762
See application file for complete search history.

(56) References Cited

U.S. PATENT DOCUMENTS 10,811,304 B2 * 10/2020 Sung ................... H01L 23/535
11,640,987 B2 * 5/2023 Waite ............... H01L 21/26586
                                                          438/268
2011/0263090 A1 * 10/2011 Kim .................... H10D 84/016
                                                          438/270
2016/0064498 A1 * 3/2016 Liu ........................ H10B 43/10
                                                          438/587
2020/0027733 A1    1/2020 Hautala

OTHER PUBLICATIONS

Cho et al., "Suppression of the Floating-Body Effect of Vertical-Cell DRAM With the Buried Body Engineering Method", IEEE Transactions on Electron Devices, vol. 65, No. 8, Aug. 2018, pp. 3237-3242.
Chung et al., "Novel 4F2 DRAM Cell with Vertical Pillar Transistor(VPT)", 78-1-4577-0708-7/11, pp. 211-214.
Vandana B., "Study of Floating Body Effect in SOI Technology", International Journal of Modern Engineering Research (IJMER), www.ijmer.com vol. 3, Issue. 3, May-Jun. 2013, ISSN: 2249-6645, pp. 1817-1824.

* cited by examiner

*Primary Examiner* — Richard A Booth
(74) *Attorney, Agent, or Firm* — KDW Firm, PLLC

(57) ABSTRACT

Disclosed herein are approaches for forming contacts in a $4F^2$ vertical dynamic random-access memory device. One method includes forming a hardmask over a plurality of pillars and over a plurality of anchors, wherein the pillars are separated from one another by a STI, and removing the STI and etching through the hardmask to form a plurality of gate trenches. The method may further include delivering a capping material to the pillars at a non-zero angle relative to a perpendicular extending from an upper surface of the pillars, wherein the capping material forms a capping layer along an upper portion of the pillars without forming the capping layer along a lower portion of the pillars. The method may further include etching the pillars to trim the lower portion of the pillars, and forming a plurality of contacts in the upper portion of the pillars.

16 Claims, 10 Drawing Sheets

VERTICAL FinFet FORMATION USING DIRECTIONAL DEPOSITION

FIELD OF THE DISCLOSURE

The present disclosure relates to semiconductor structures and, more particularly, to vertical finFET formation using directional deposition.

BACKGROUND OF THE DISCLOSURE

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, $4F^2$ DRAM devices have been developed. However, current $4F^2$ DRAM devices have off-leakage current issues for vertical channel transistors. The off-leakage current is caused by the floating body effect caused by hole accumulation into the body of the $4F^2$ DRAM device.

It is with respect to these and other drawbacks of the current art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a hardmask over a plurality of pillars and over a plurality of anchors, wherein the plurality of pillars are separated from one another by a shallow trench isolation (STI), and removing the STI and etching through the hardmask to form a plurality of gate trenches. The method may further include delivering a capping material to the plurality of pillars at a non-zero angle relative to a perpendicular extending from an upper surface of the plurality of pillars, wherein the capping material forms a capping layer along an upper portion of the plurality of pillars without forming the capping layer along a lower portion of the plurality of pillars. The method may further include etching the plurality of pillars to trim the lower portion of the plurality of pillars, and forming a plurality of contacts in the upper portion of the plurality of pillars.

In another aspect, a dynamic random-access memory device may include a plurality of vertical pillar structures extending from a substrate, each of the plurality of vertical pillar structures having an upper portion and a lower portion, and a gate trench defined by a set of vertical pillars of the plurality of vertical pillar structures. The dynamic random-access memory device may further include a gate device within the gate trench, and a contact formed in the upper portion of each vertical pillar structure of the set of vertical pillar structures, wherein the contact extends partially over the gate device.

In yet another aspect, a method of forming a $4F^2$ vertical dynamic random-access memory device may include forming a hardmask over a plurality of pillars and over a plurality of anchors, wherein the plurality of pillars are separated from one another by a shallow trench isolation (STI), and removing the STI and etching through the hardmask to form a plurality of gate trenches and a plurality of vertical pillar structures. The method may further include delivering a capping material to the plurality of vertical pillar structures at a non-zero angle relative to a perpendicular extending from an upper surface of the plurality of pillars, wherein the capping material forms a capping layer along an upper portion of the plurality of vertical pillar structures without forming the capping layer along a lower portion of the plurality of vertical pillar structures. The method may further include etching the plurality of vertical pillar structures to trim the lower portion of the plurality of vertical pillar structures, and forming a plurality of contacts in the upper portion of the plurality of vertical pillar structures.

BRIEF DESCRIPTION OF THE DRAWINGS

The accompanying drawings illustrate exemplary approaches of the disclosure, including the practical application of the principles thereof, as follows.

Figure 1A:
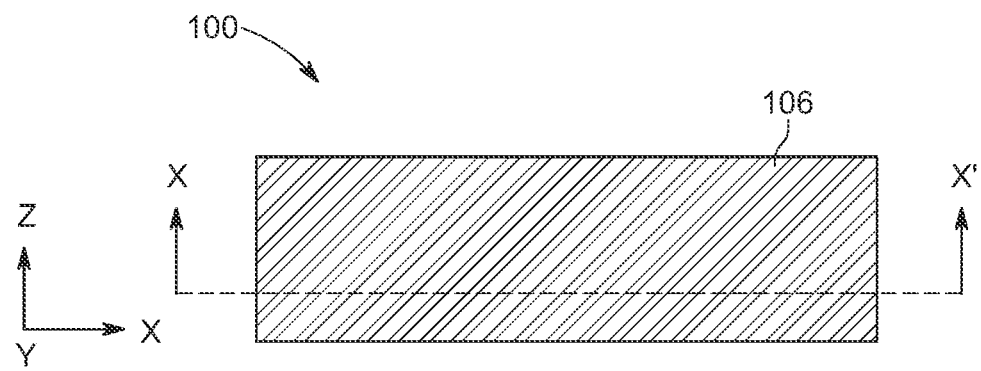
FIG. 1A illustrates a top view of a device at one stage of processing, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, disclosed herein are dumbbell shape vertical finFET pillars with anchors to solve the floating-body effect and improve device performance. To form the vertical finFET pillars, a directional deposition technique may be used to form a capping layer, which shields an upper portion of the vertical finFET pillars from a subsequent etch. Contacts and top source/drains (S/D) may be formed in the upper portion of the vertical finFET pillars, wherein the relatively larger top S/D enables a lower contact resistance and improved array to capacitor contact. Furthermore, the thinner channel formed in a lower portion of the vertical finFET pillars suppresses the floating body effect and improves short channel control. Meanwhile, the anchors advantageously stabilize the device to enable taller vertical finFET pillars for better leakage control.

Figure 1B:
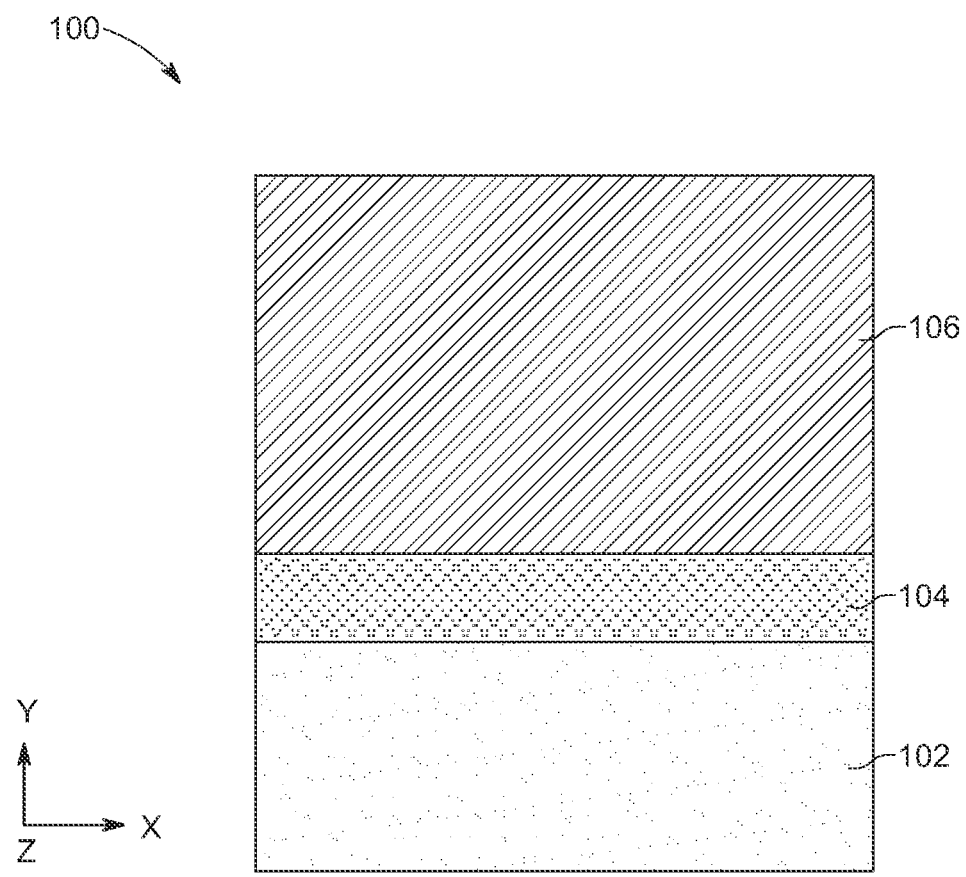
FIG. 1B illustrates a cross-sectional side view of the device of FIG. 1A along cutline X-X', according to embodiments of the present disclosure.

FIG. 1A is a top view and FIG. 1B is a side cross-sectional view (along cutline X-X') of a portion of a semiconductor device (hereinafter "device") 100, such as a DRAM device, at one stage of processing, according to embodiments of the present disclosure. As shown, the device 100 may include a base or substrate 102, a buried bitline 104 (e.g., N+) formed atop the substrate 102, and an epitaxial (epi) layer 106 (e.g., P+) formed atop the buried bitline 104.

Figure 2A:
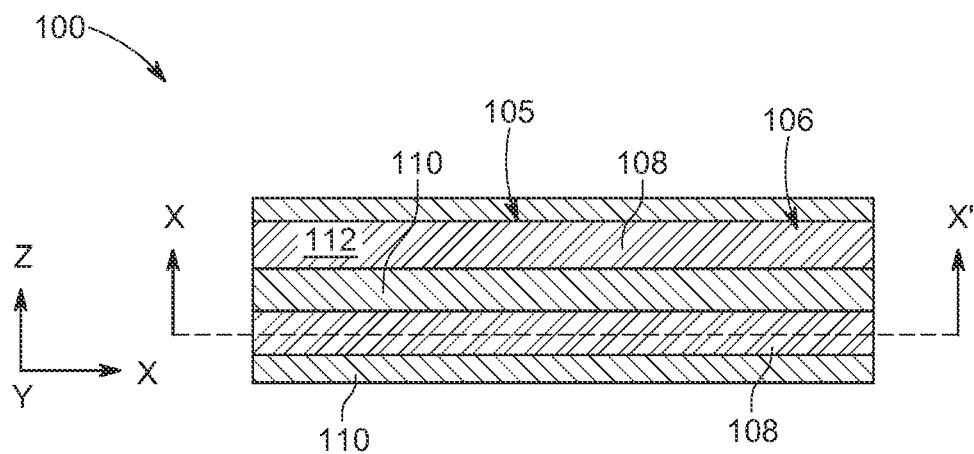
FIG. 2A illustrates a top view of the device following formation of a set of pillars, according to embodiments of the present disclosure.
Figure 2B:
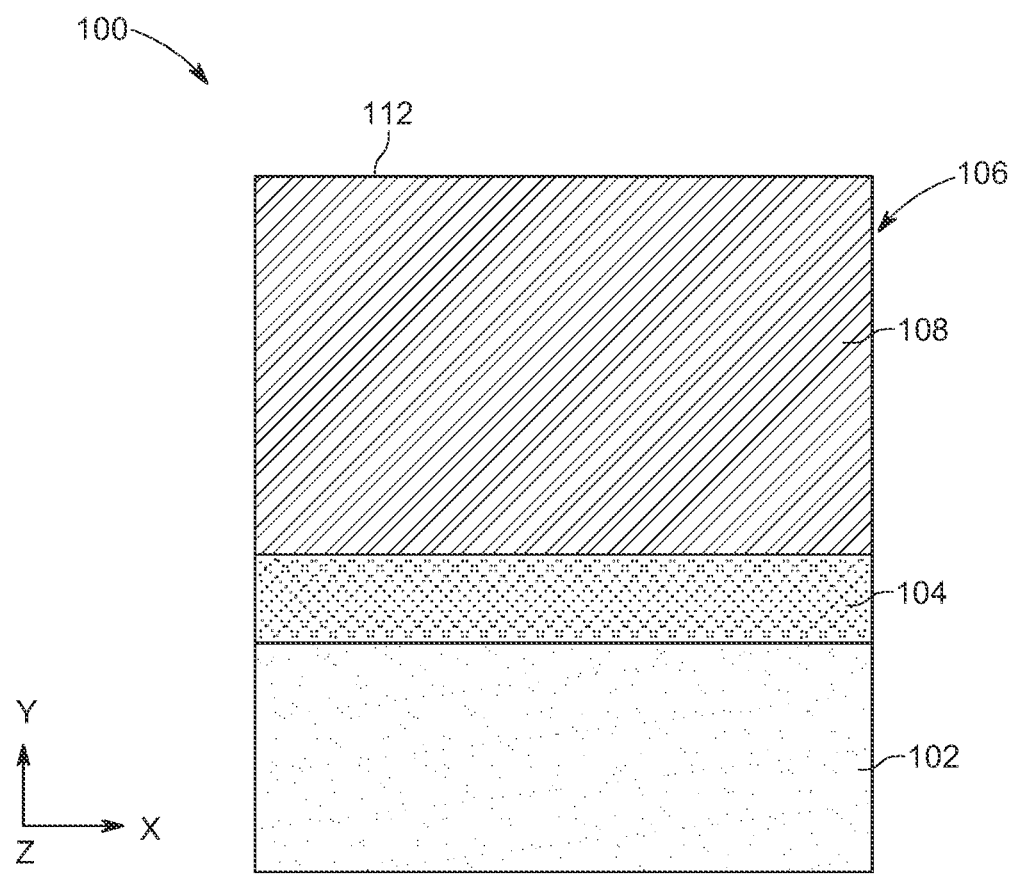
FIG. 2B illustrates a cross-sectional side view of the device of FIG. 2A along cutline X-X', according to embodiments of the present disclosure.

FIG. 2A is a top view and FIG. 2B is a side cross-sectional view (along cutline X-X') of the device 100 following formation of a plurality of pillars 108 from the epi layer 106. In some embodiments, the pillars 108 may be formed by etching the epi layer 106 and the buried bitline 104 to form a plurality of pillar trenches 105, and then forming a shallow trench isolation (STI) 110 within the pillar trenches 105. The STI 110 may be an oxide, and the epi layer 106 may be silicon. As shown, the pillars 108 and the STI 110 may extend primarily in a first direction (e.g., x-direction). After deposition, the STI 110 may be planarized selective to an upper surface 112 of the pillars 108.

Figure 3A:
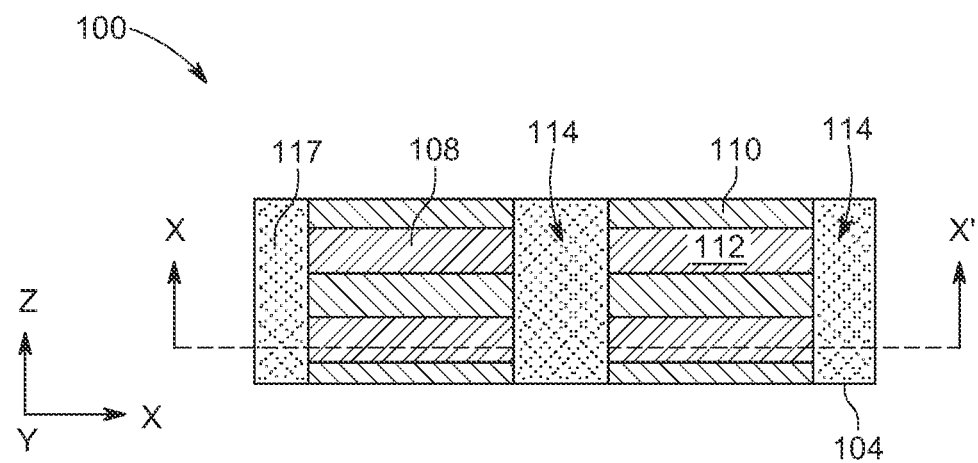
FIG. 3A illustrates a top view of the device following a pillar cut, according to embodiments of the present disclosure.
Figure 3B:
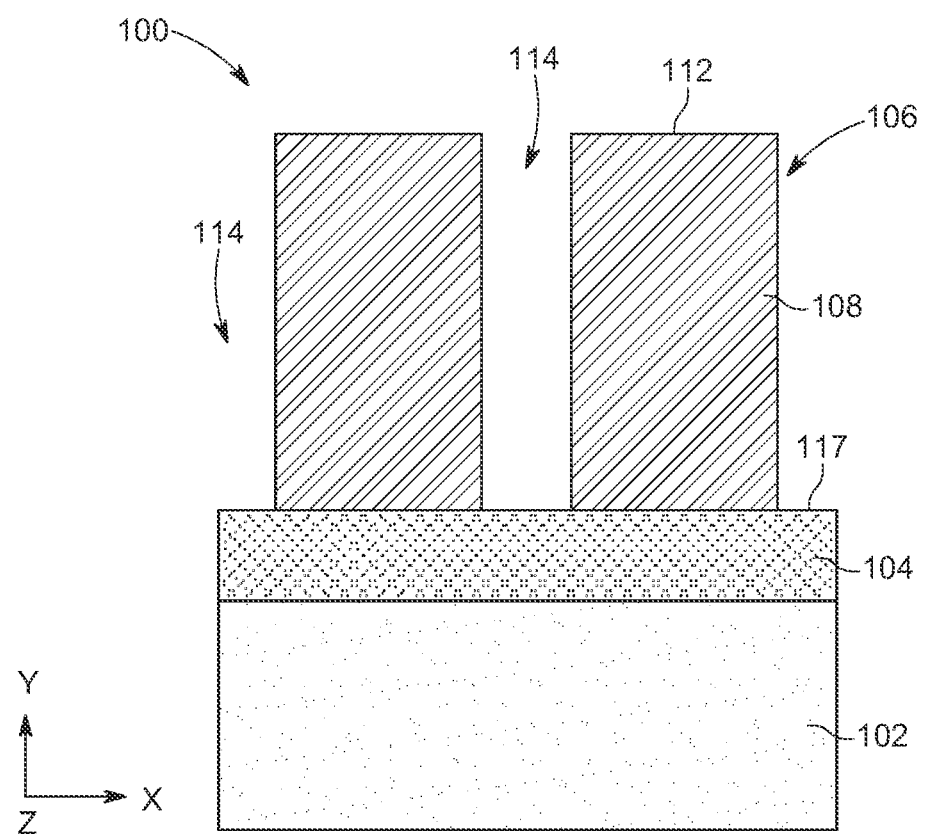
FIG. 3B illustrates a cross-sectional side view of the device of FIG. 3A along cutline X-X', according to embodiments of the present disclosure.

FIGS. 3A-3B illustrate the device 100 following a pillar cut process to form a plurality of anchor trenches 114 through the pillars 108 and the STI 110. As shown, the anchor trenches 114 extend primarily in a second direction (e.g., z-direction), which is perpendicular to the first direction of the pillars 108. In some embodiments, the anchor trenches 114 may be formed selective to a top surface 117 of the buried bitline 104.

Figure 4A:
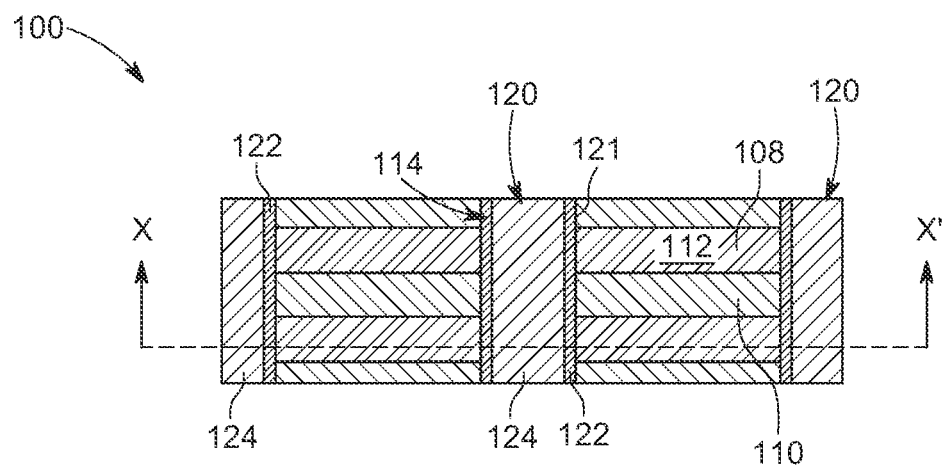
FIG. 4A illustrates a top view of the device following formation of a set of anchors, according to embodiments of the present disclosure.
Figure 4B:
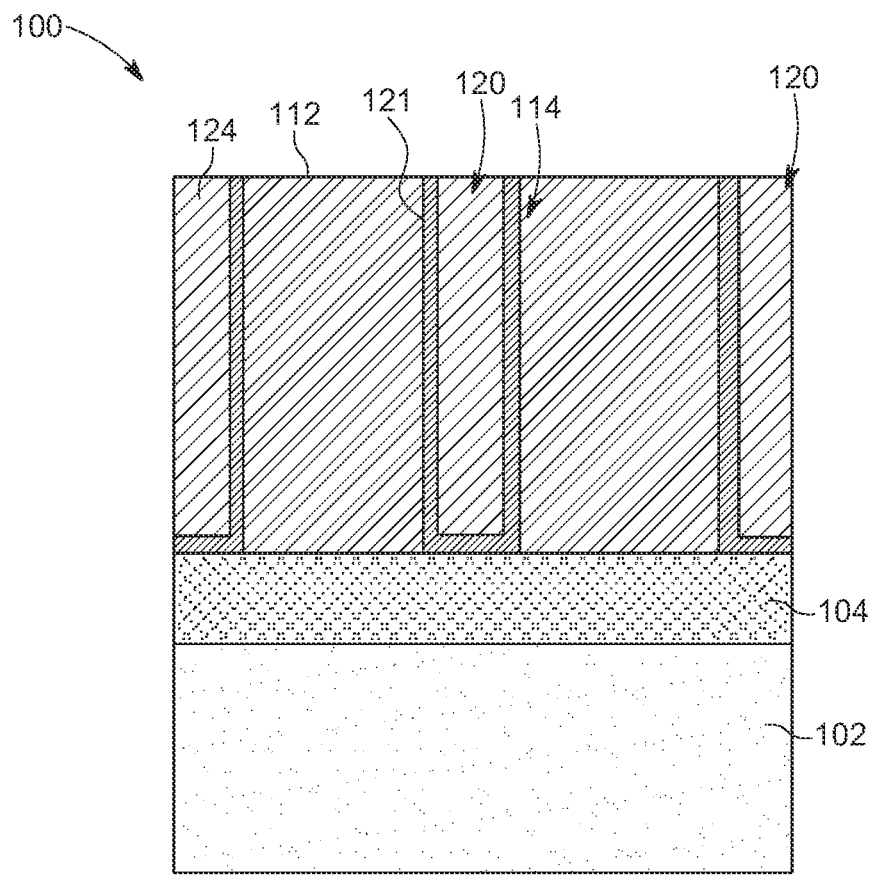
FIG. 4B illustrates a cross-sectional side view of the device of FIG. 4A along cutline X-X', according to embodiments of the present disclosure.

FIGS. 4A-4B illustrate the device 100 following formation of a plurality of anchors 120 within the anchor trenches 114. In some embodiments, the anchors 120 may include a nitride layer 122 (e.g., SiN) formed along an inner surface 121 of the anchor trenches 114, and an oxide layer 124 (e.g., SiO) deposited over the nitride layer 122. In some embodiments, the oxide layer 124 may be deposited and then planarized selective to the upper surface 112 of the pillars 108. In some embodiments, the nitride layer 122 and the oxide layer 124 may be deposited using other materials having etch selectivity with oxide, such as low-K materials, SiON, SiOCN, SiOBN, SiCN, etc., all of which may benefit the device performance further for capacitance improvement.

Figure 5A:
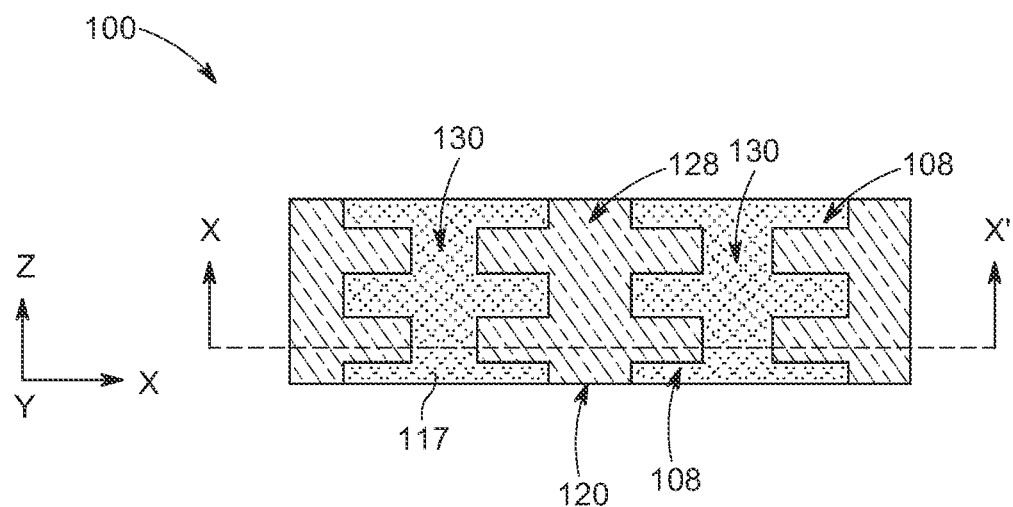
FIG. 5A illustrates a top view of the device following an active pillar etch to form gate trenches, according to embodiments of the present disclosure.
Figure 5B:
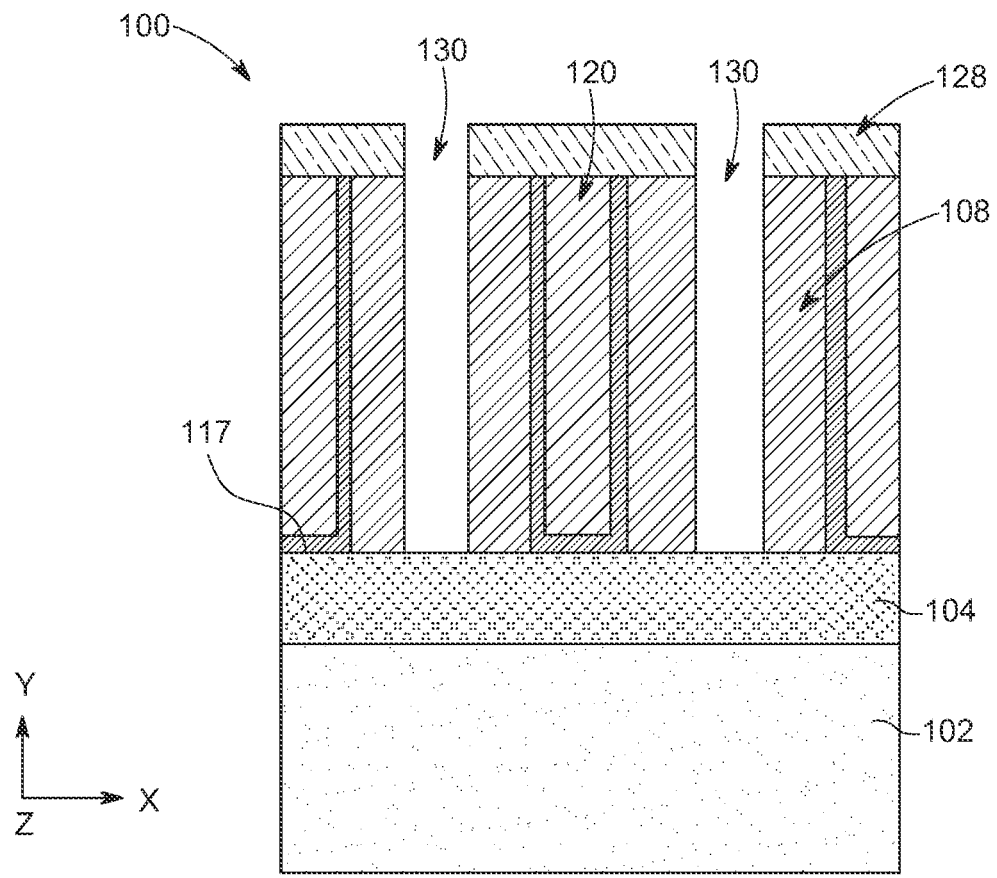
FIG. 5B illustrates a cross-sectional side view of the device of FIG. 5A along cutline X-X', according to embodiments of the present disclosure.

FIGS. 5A-5B illustrate the device 100 following formation of a hardmask 128 over the pillars 108 and the anchors 120, and following removal of the STI 110 from between the pillars 108. As further shown, a plurality of gate trenches 130 may be formed by etching through the hardmask 128 and the pillars 108. In some embodiments, the hardmask 128 and the pillars 108 may be removed using a vertical etch selective to the top surface 117 of the buried bitline 104. Once the STI 110 is removed, the gate trenches 130 may extend in both the first direction (e.g., x-direction) and the second direction (e.g., z-direction).

Figure 6A:
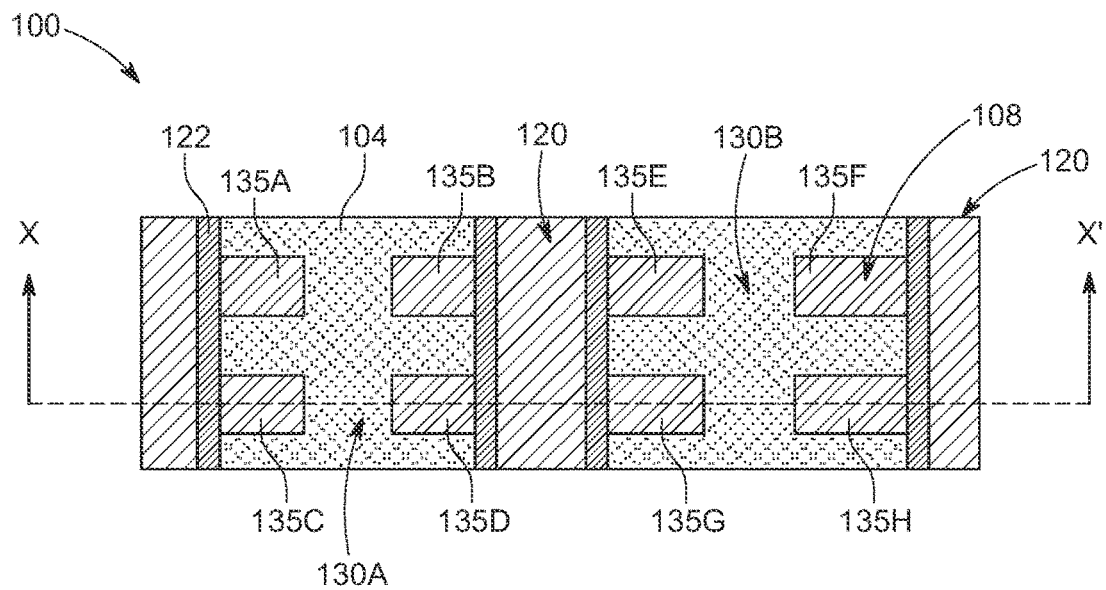
FIG. 6A illustrates a top view of the device following removal of a hardmask, according to embodiments of the present disclosure.
Figure 6B:
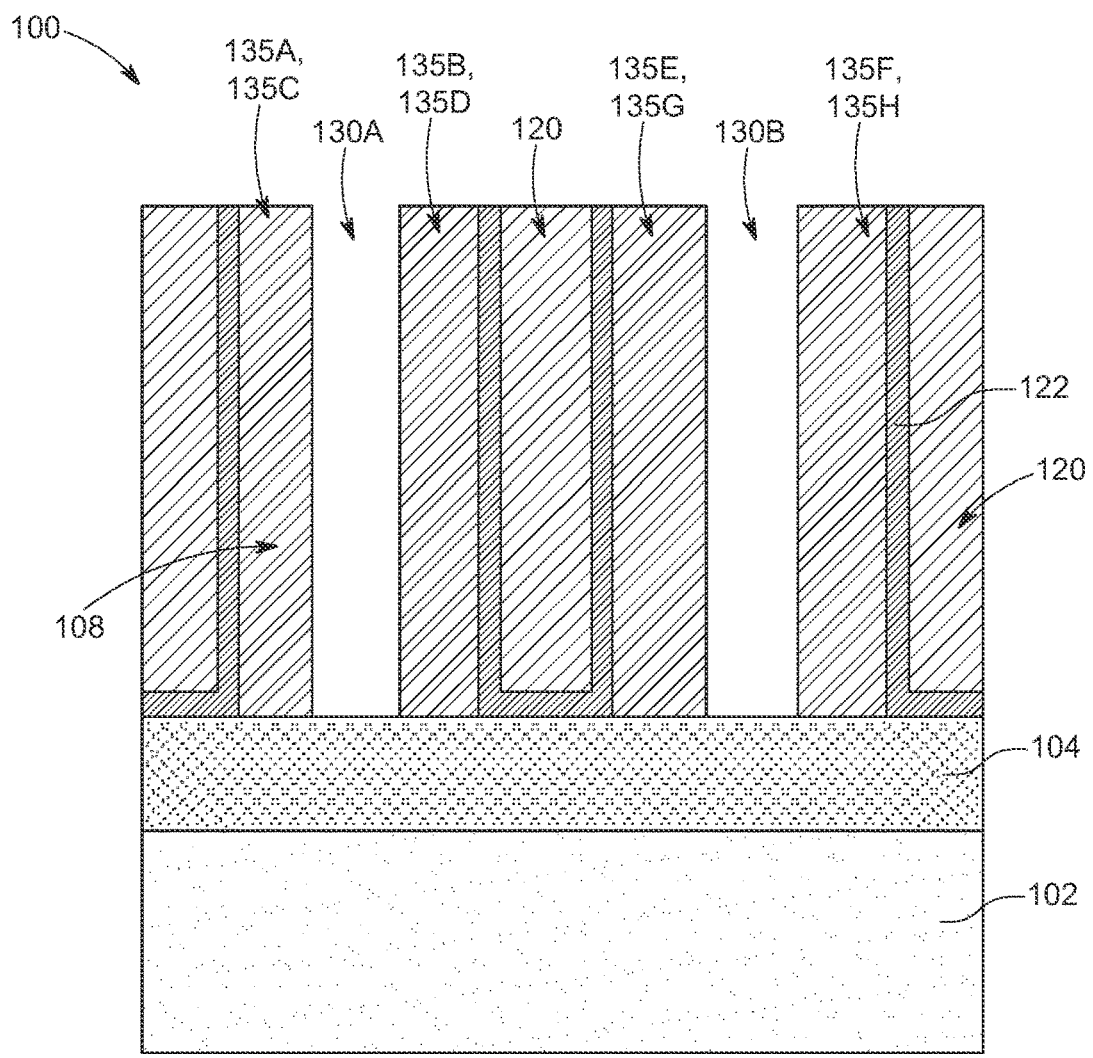
FIG. 6B illustrates a cross-sectional side view of the device of FIG. 6A along cutline X-X', according to embodiments of the present disclosure.

FIGS. 6A-6B illustrate the device 100 following removal of the hardmask 128 to reveal the pillars 108, hereinafter referred to as a plurality of vertical pillar structures 135A-135N (i.e., finFETs). As shown, each of the plurality of vertical pillar structures 135A-135N is connected to one of the anchors 120. More specifically, in some embodiments, the vertical pillar structures 135A-135N may be provided directly adjacent the nitride layer 122 of the anchors 120. As shown, vertical structures 135A and 135B, and vertical structures 135C and 135D, may be separated from one another by gate trench 130A. Similarly, vertical structures 135E and 135F, and vertical structures 135G and 135H, may be separated from one another by gate trench 130B. In some embodiments, gate trench 130A may further separate vertical structure 135A from vertical structure 135C and separate vertical structure 135B from vertical structure 135D. Similarly, gate trench 130B may further separate vertical structure 135E from vertical structure 135G and separate vertical structure 135F from vertical structure 135H. As demonstrated, each of the gate trenches 130A, 130B may extend in 3 dimensions.

Figure 7A:
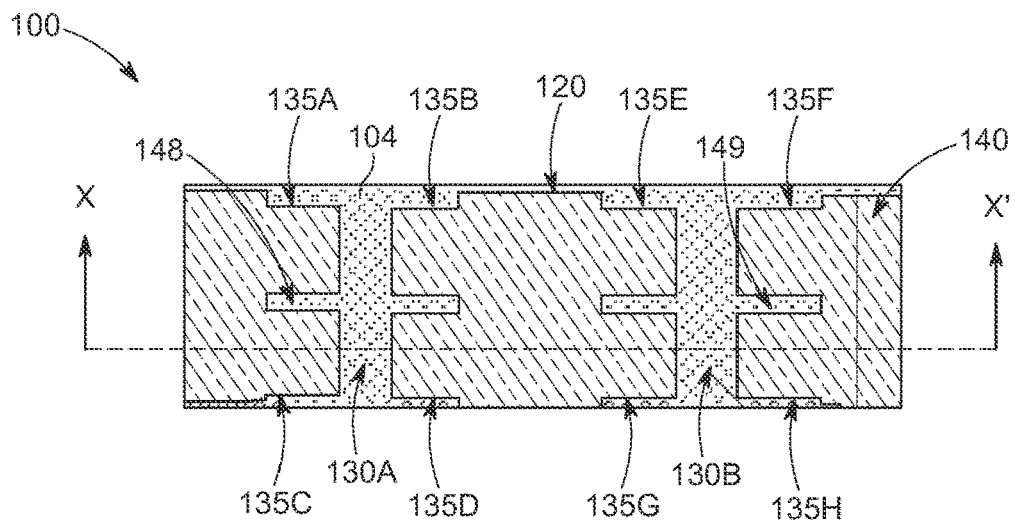
FIG. 7A illustrates a top view of the device following deposition of a capping layer, according to embodiments of the present disclosure.
Figure 7B:
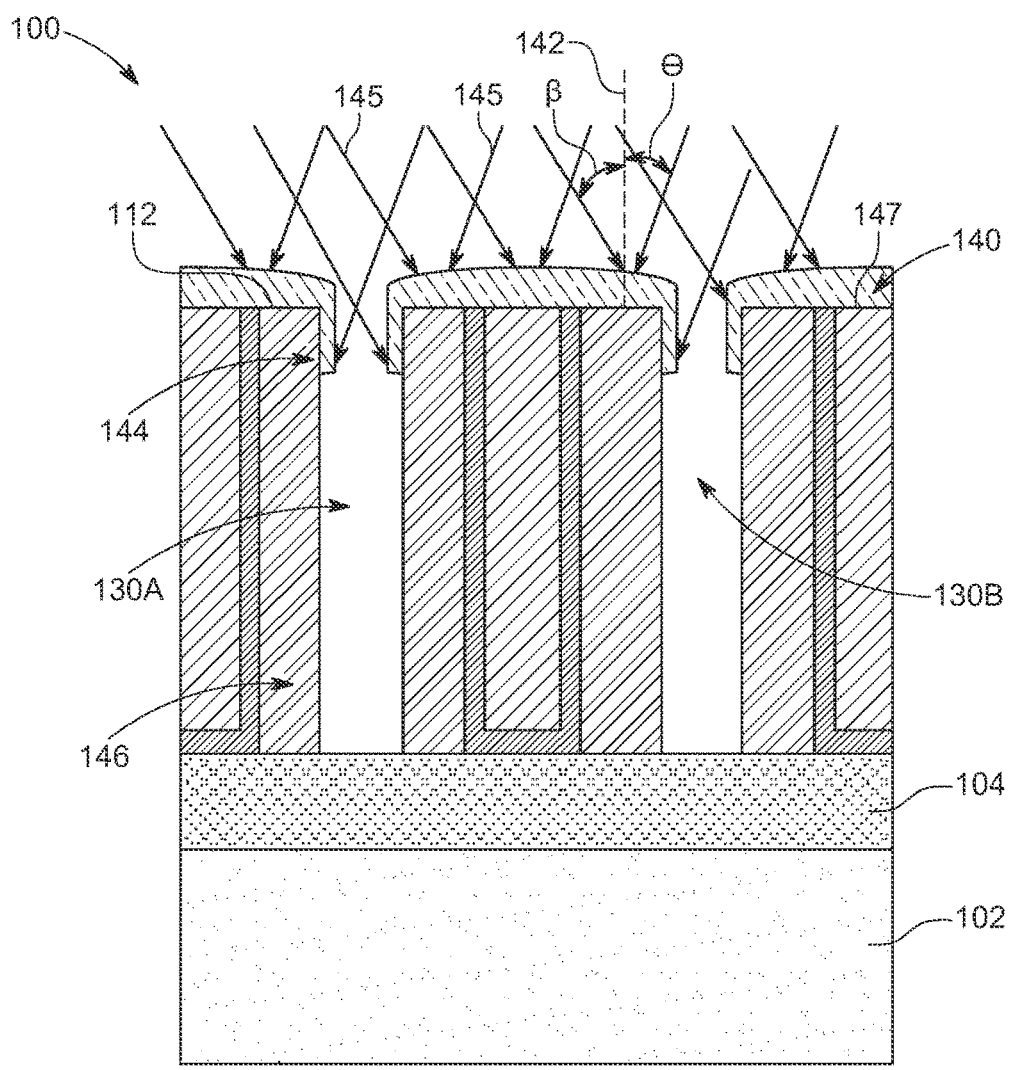
FIG. 7B illustrates a cross-sectional side view of the device of FIG. 7A along cutline X-X', according to embodiments of the present disclosure.

FIGS. 7A-7B illustrate the device 100 following formation of a capping layer 140 over the vertical pillar structures 135A-135N and over the anchors 120. In some embodiments, the capping layer 140 is formed by delivering a capping material to the vertical pillar structures 135A-135N at one or more non-zero angles (e.g., (3 and 0) relative to a perpendicular 142 extending from the upper surface 112 of the vertical pillar structures 135A-135N. As will be described in greater detail below, the capping material may be deposited using a ribbon beam plasma-enhanced chemical vapor deposition (PECVD) process 145 to form the capping layer 140 along an upper portion 144 of the plurality of vertical pillar structures 135A-135N without forming the capping layer 140 along a lower portion 146 of the plurality of vertical pillar structures 135A-135N. The capping layer 140 may be further formed along an upper surface 147 of the anchors 120, but is prevented from being formed along the top surface 117 of the buried bitline 104.

As best shown in FIG. 7A, the capping layer 140 may be formed with a gap 148 present between vertical structure 135A and vertical structure 135C, and between vertical structure 135B from vertical structure 135D. Similarly, the capping layer 140 may be formed with a gap 149 present between vertical structure 135E and vertical structure 135G, and between vertical structure 135F and vertical structure 135H. In some embodiments, the capping layer 140 may be formed during or in between rotations of the substrate 102 to enable 3-D application of the capping material, as desired. In some embodiments, the capping materials may include any of SiN, SiCN SiOCN, or SiBCN, with etch selectivity to silicon.

Figure 8A:
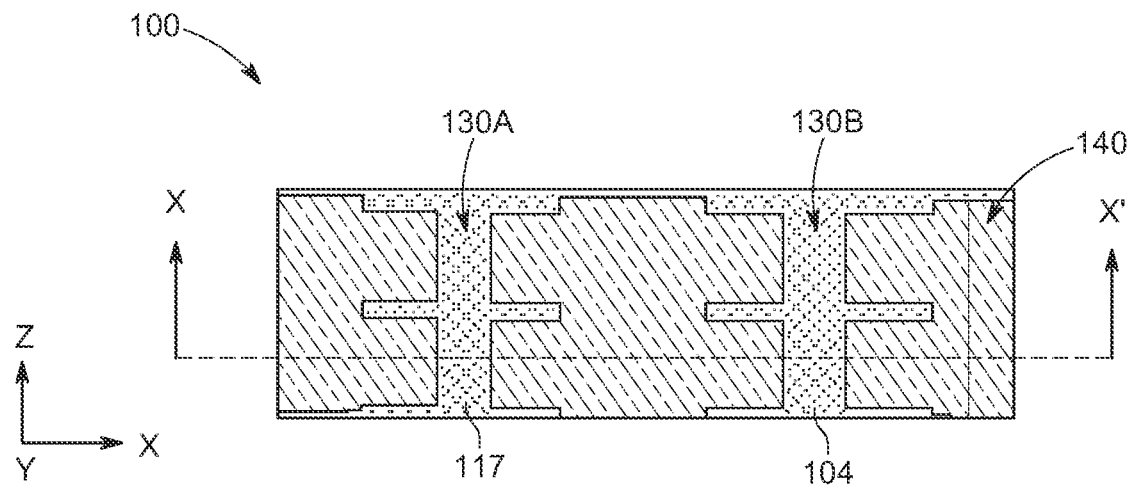
FIG. 8A illustrates a top view of the device following a fin trim process, according to embodiments of the present disclosure.
Figure 8B:
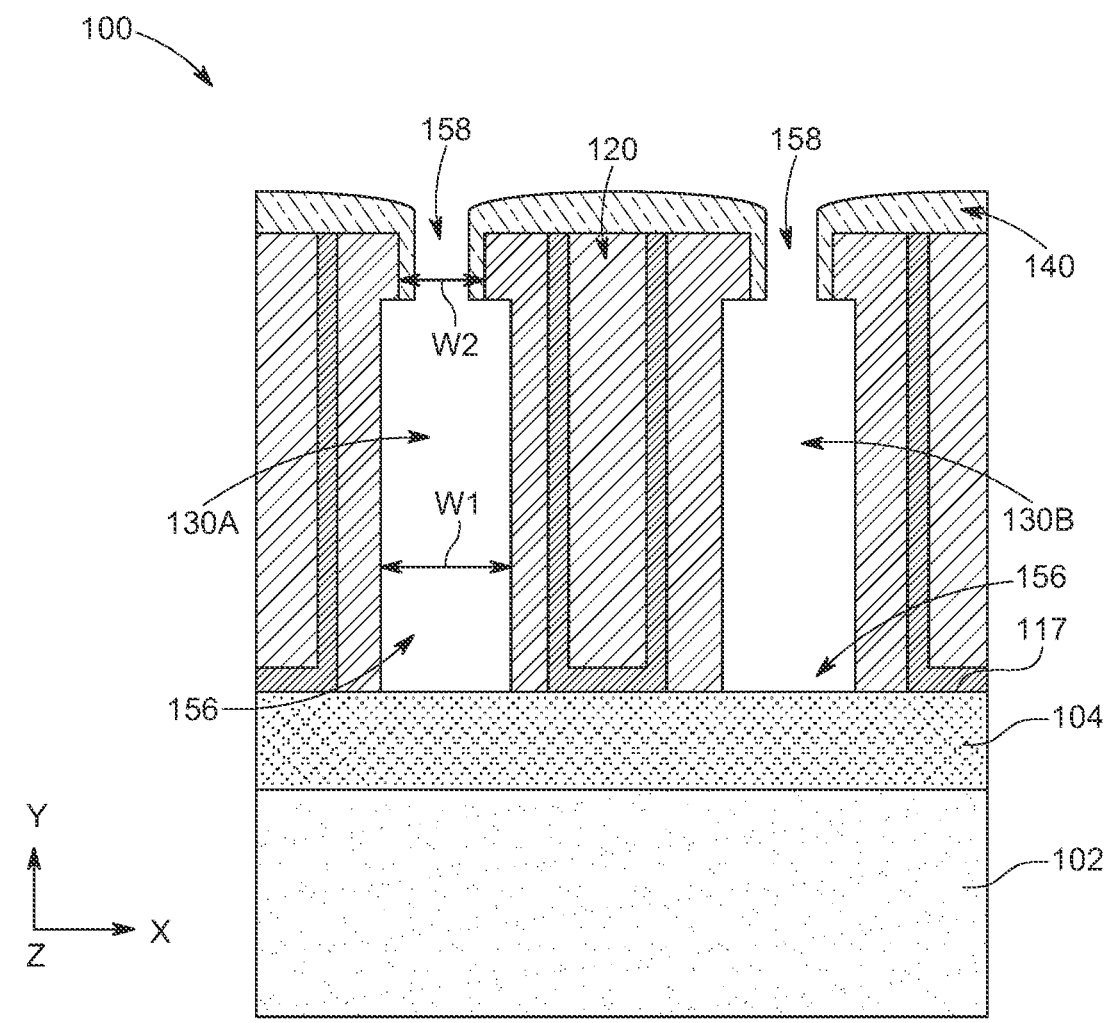
FIG. 8B illustrates a cross-sectional side view of the device of FIG. 8A along cutline X-X', according to embodiments of the present disclosure.

FIGS. 8A-8B illustrate the device 100 following a fin trim process to increase a volume of the gate trenches 130A, 130B. In some embodiments, a selective removal process (SRP) may be used to trim the lower portion of the plurality of pillars, which increases a first width of a lower section 156 of gate trenches 130A, 130B. Due to the presence of the capping layer 140 along the upper portion 144 of the plurality of vertical pillar structures 135A-135N, a plasma etch of the SRP may not significantly impact an upper section 158 of the gate trenches 130A, 130B. A first width 'W1' of the lower section 156 of the gate trenches 130A, 130B is therefore larger than a second width 'W2' of the upper section 158 of the gate trenches 130A, 130B.

In some embodiments, an SRP tool may be used to laterally recess the plurality of vertical pillar structures 135A-135N in the lower section 156. By adjusting the SRP, the amount of lateral etching may be precisely controlled. Lateral etching refers to etching substantially in the x-direction. In some embodiments, lateral etching is also performed in the z-direction. As shown, the SRP is selective to the top surface 117 of the buried bitline 104. It will be appreciated that the silicon of the vertical pillar structures 135A-135N can be recessed in various alternative embodiments using any suitable recess technique, including, but not limited to, wet etching, vapor etching, isotropic plasma etch or any other SRP.

Figure 9A:
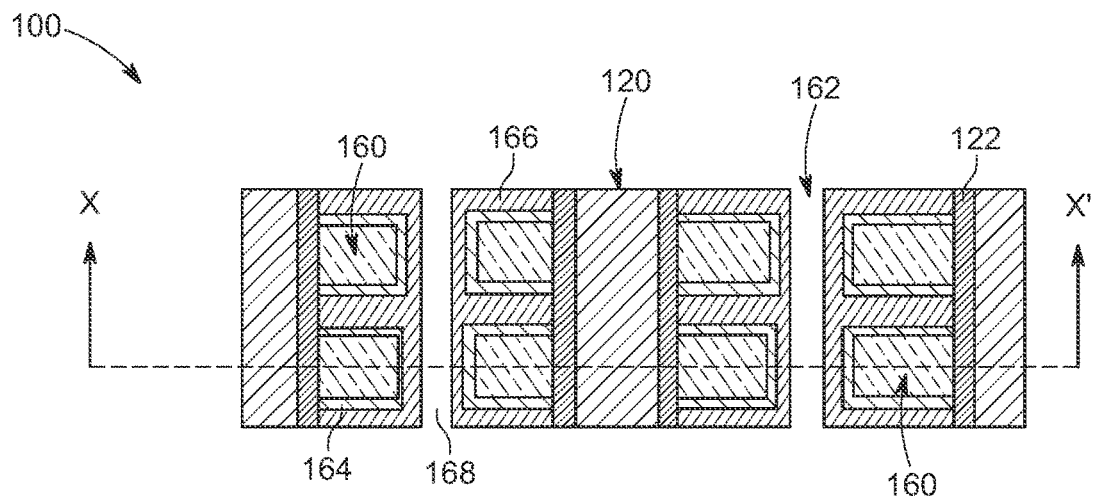
FIG. 9A illustrates a top view of the device following formation of a set of contacts, according to embodiments of the present disclosure.
Figure 9B:
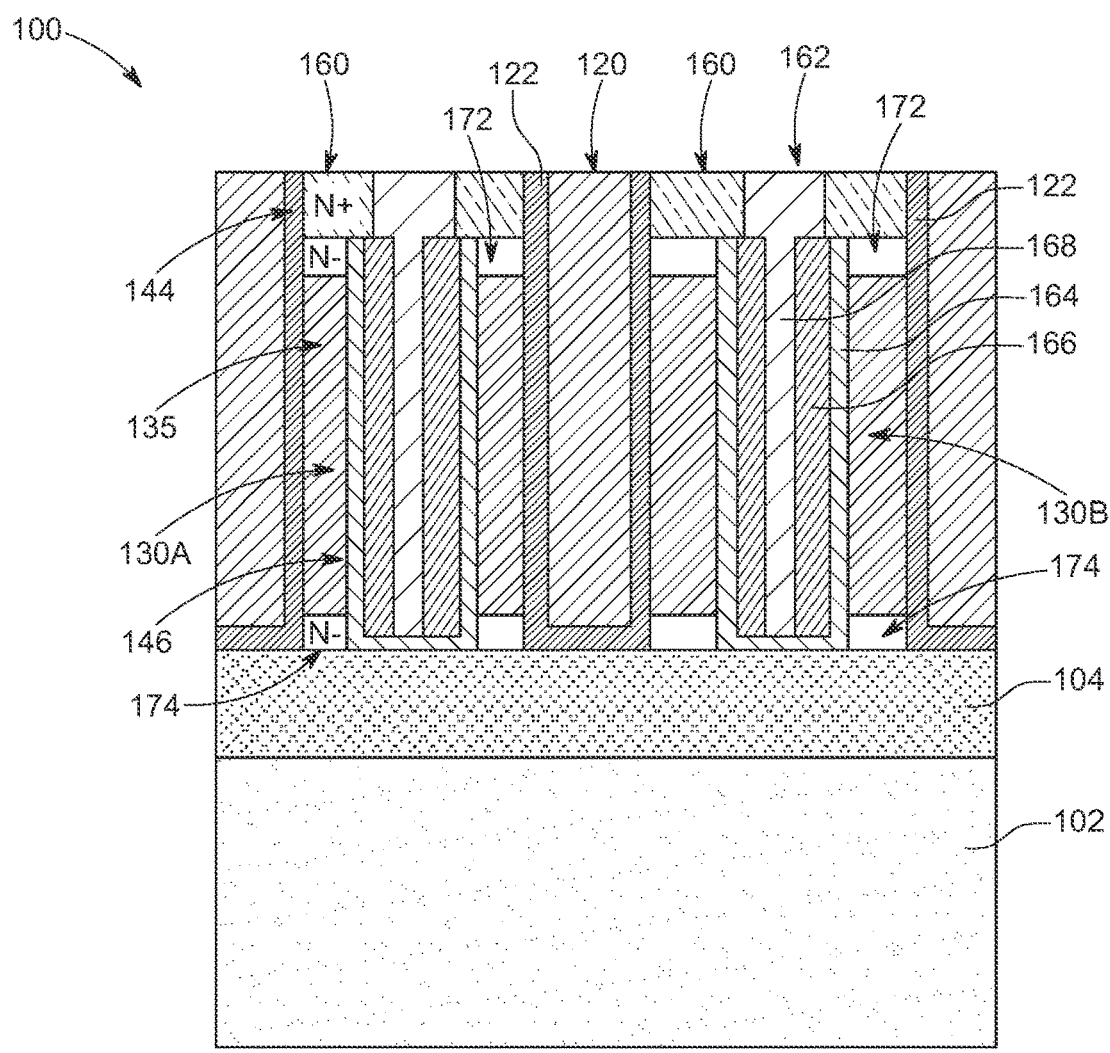
FIG. 9B illustrates a cross-sectional side view of the device of FIG. 9A along cutline X-X', according to embodiments of the present disclosure.

As demonstrated in FIGS. 9A-9B, the capping layer 140 is removed from the device 100, and a set of contacts 160 (e.g., N+) and a gate device 162 is formed therein. More specifically, the contacts 160 may be formed in the upper portion 144 of the plurality of vertical pillar structures 135, wherein the contacts 160 extend partially over the corresponding gate device 162. As shown, the contacts 160 may extend over a gate oxide 164 of the gate devices 162. Each gate device 162 may further include a gate material 166 formed atop the gate oxide 164, and a dielectric isolation material 168 formed over the gate material 166. As shown, the contacts 160 may abut the nitride layer 122 of the anchors 120.

As further shown, an upper source/drain (S/D) 172 may be formed in the upper portion 144 of the plurality of vertical pillar structures 135, beneath the contacts 160. Furthermore, a lower S/D 174 may be formed in the lower portion 146 of each vertical pillar of the vertical pillar structures 135. In some embodiments, the upper S/D 172 and/or the lower S/D may be formed or defined by diffusion into the vertical pillar structures 135.

Figure 10:
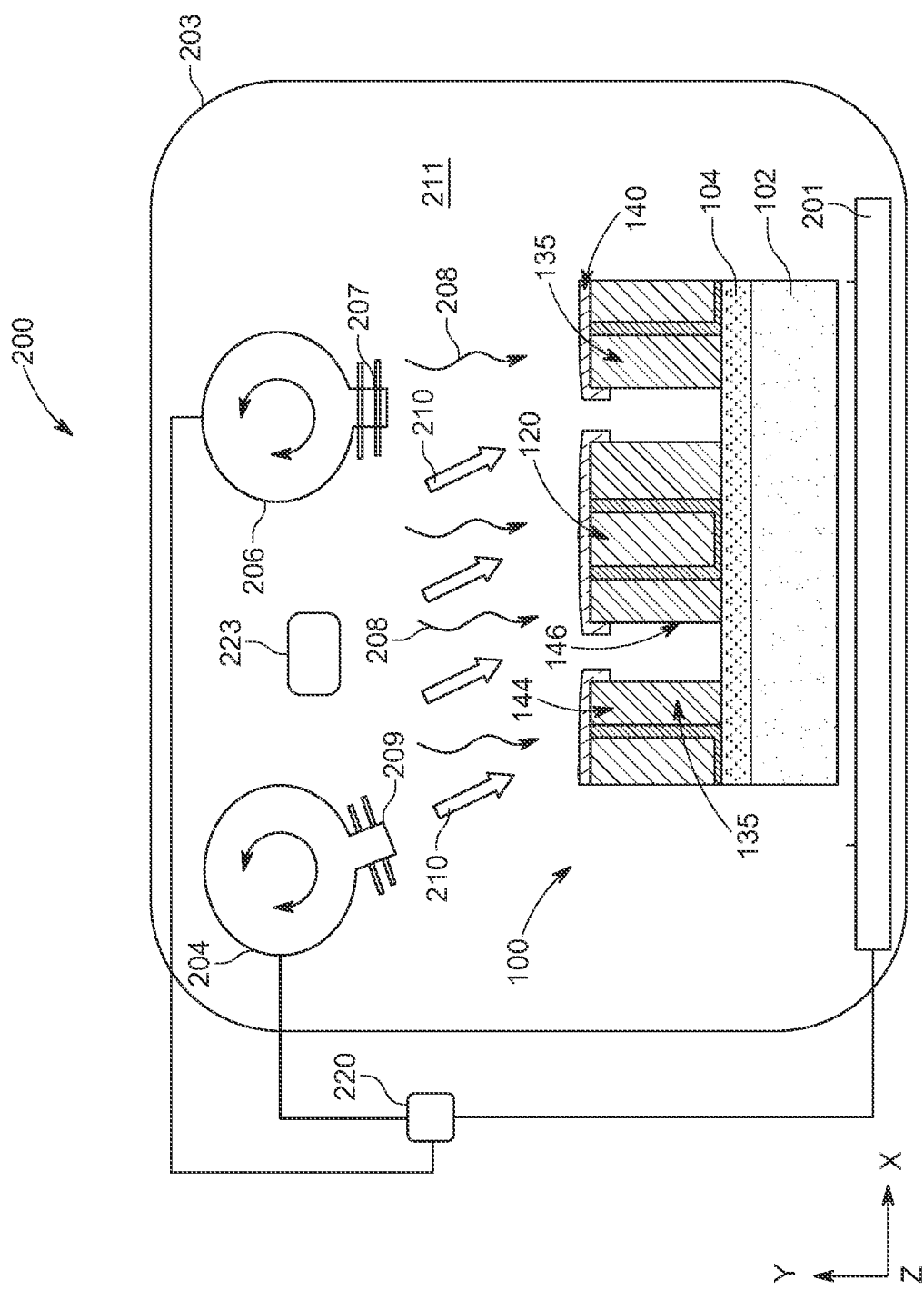
FIG. 10 illustrates a diagram of a processing apparatus according to embodiments of the present disclosure.

Turning now to FIG. 10, an arrangement or system 200 for selective deposition according to embodiments of the disclosure is shown. Among other things, the system 200 may be used to deposit the capping layer 140 over the device 100, as shown in FIGS. 7A-7B and described above. The system 200 may include a substrate stage 201 to scan the substrate 102 in the x, y, and/or z-directions. For example, the substrate stage 201 may move the substrate 102 between a first position adjacent a deposition source 206 to a second position adjacent an ion source 204. The system 200 may use a processing apparatus 211, including a process chamber 203 to house the device 100. In various embodiments, the deposition source 206 may be disposed in a first region of the process chamber 203, while the ion source 204 is disposed in a second region of the process chamber 203.

The processing apparatus 211 may further include a controller 223, coupled to the deposition source 206 and to the ion source 204, wherein the controller 223 may be arranged to control various components of the processing apparatus 211. In brief, the controller 220 may be used to send control signals to a bias source 220 to bias the process chamber 203 with respect to the ion source 204 and/or bias the process chamber 203 with respect to the device 100, e.g., to change the orientation of the ion source 204 or orientation of the deposition source 206, to scan the substrate stage 201, and so forth.

During use, species 208 and angled ions 210 may be directed to the device 100 to form the capping layer 140 over the vertical pillar structures 135. In some embodiments, the depositing species 208 and angled ions 210 may be directed to the same region of the substrate device 100, either simultaneously, or in sequential fashion. In some embodiments, scanning the substrate stage 201 may take place while the substrate 102 is exposed simultaneously to the depositing species 208 and angled ions 210. In other embodiments where the angled ions 210 and depositing species 208 are directed towards different regions of the process chamber 203, the substrate stage 201 may be scanned so the substrate 102 is exposed sequentially to depositing species 208 from the deposition source 206 and to angled ions 210 from the ion source 204. As shown in FIGS. 7A-7B, the device 100 includes a 3-D structure, which may represent a set of pillars, mesas, lines, fin structures, vias, trenches, mask features, or other structures having surfaces extending proud of a substrate plane or into a substrate. As such, the 3-D structure may present certain features or portions of features tending to shadow other features from incident species depending upon the angle of incidence of the incident species.

The deposition source 206 may provide depositing species 208 in the form of ions, excited neutrals, radicals, or other species capable of depositing on the vertical pillar structures 135 and the anchors 120. In some examples, a feed gas may be fed into the deposition source 206, providing the appropriate species such as $SiH_4$, $CH_4$, or $NH_3$, optionally in combination with other gases, such as oxygen, nitrogen, hydrogen, and so forth, for depositing a given layer, such as silicon, carbon, silicon nitride, silicon oxide, and so forth. In some embodiments, the deposition source 206 may be a first plasma chamber, excited by a microwave or RF power source to generate a plasma including reactive species. The depositing species 208 may be provided as known reactive species to the vertical pillar structures 135 and anchors 120, where the depositing species 208 are directed through an orifice 207 of the deposition source 206 toward the device 100, and may generally diffuse toward the device 100 and impinge upon the vertical pillar structures 135 and anchors 120 at many different angles. In some examples, the depositing species 208 may impinge upon the device 100 in an isotropic fashion and may tend to form a conformal coating, as represented by the capping layer 140. In some embodiments, the depositing species 208 may deposit in a manner where the deposition is symmetrically arranged on different surfaces of the device, while not being isotropic. For example, where the orifice 207 faces downwardly, as shown in FIG. 10, the depositing species may deposit on all exposed surfaces while depositing on horizontal surfaces to a greater extent than on vertical surfaces.

Examples of suitable materials for capping layer 140 may include materials amendable for deposition by known plasma enhanced chemical vapor deposition techniques, including Si, $SiO_2$, SiN, SiC, SiCN, SiOC, SiOCN, Ge, $SiGe_x$, TiN, among others. In some examples, during deposition of the capping layer 140, the substrate stage 201 (or a platen disposed thereon) may be held at room temperature, or heated up to 500° C. The embodiments are not limited in this context.

The capping layer 140 may be formed under conditions where the depositing species 208 condense upon the device 100 with low kinetic energy, such as less than a few eV, and in some cases less than 1 eV energy. In some embodiments, the substrate stage 201 may be biased with respect to the deposition source 206 at zero volts or a slight positive voltage (positive potential), such as +10 V to +50 V. In some embodiments, the deposition source 206 may be rotatable around (about) an axis, such as the z-axis in the Cartesian coordinate system shown.

In some embodiments, the ion source 204 may be a second plasma chamber generating a plasma containing inert gas ions such as $Ar^+$, $Kr^+$, $Xe^+$, or reactive ions, such as O+, N+, O2+. N2+, and so forth. According to various embodiments, the ion source 204 and the deposition source 206 may be arranged with a known triode extraction system, including ground and suppression electrodes. The embodiments are not limited in this context. The ion source 204 may act as an angled ion source where ions are extracted from the ion source 204 through orifice 209 and directed as angled ions 210 to the device 100. Notably, the angled ions 210 may be shadowed by features in the device 100. For example, the angled ions 210 may be provided as a collimated ion beam, where the angled ions 210 are parallel to one another or have trajectories forming a low angular spread, such as less than 10 degrees. As such, the angled ions 210 may tend to be shadowed in like regions of similar features within the 3-D structure of the device 100, such as the vertical pillar structures 135. In this manner, the angled ions 210 may impinge upon the upper portion 144 of the vertical pillar structures 135 without impinging upon the lower portion 146 of the vertical pillar structures 135. In various embodiments, the angled ions 210 may be provided with ion energy of 50 eV up to 3 keV, or 5 keV, or 10 keV. The embodiments are not limited in this context, however.

According to various embodiments, the angle of incidence of angled ions 210 with respect to a perpendicular to a plane of the substrate 102 may be set by tilting the substrate stage 201 with respect to the ion source 204 and the ions 210, or by tilting the ion source 204 with respect to the substrate stage 201 and the device 100. In various embodiments, the angle of incidence of angled ions 210 may vary from zero degrees to 85 degrees.

In sum, embodiments herein provide an improved dumbbell shape vertical finFET with anchor to solve floating-body effect and improve performance. Anchors of the present disclosure are more favorable than the gate-all-around shape because cell capacitor operational voltage will not scale down, and channel length won't be reduced even as the pillar diameter is reduced. Further, pillar failure more commonly found in gate-all-around structures can be avoided when scaling. Directional deposition to the vertical finFET structures enables a selective etch process to form the final dumbbell shape finFET structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function.

Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    forming a hardmask over a plurality of pillars and over a plurality of anchors, wherein the plurality of pillars are separated from one another by a shallow trench isolation (STI);
    removing the STI and etching through the hardmask to form a plurality of gate trenches;
    delivering a capping material to the plurality of pillars at a non-zero angle relative to a perpendicular extending from an upper surface of the plurality of pillars, wherein the capping material forms a capping layer along an upper portion of the plurality of pillars without forming the capping layer along a lower portion of the plurality of pillars;
    etching the plurality of pillars to trim the lower portion of the plurality of pillars; and
    forming a plurality of contacts in the upper portion of the plurality of pillars.

2. The method of claim 1, further comprising:
    forming the plurality of pillars from an epitaxial layer, wherein the epitaxial layer is formed atop a buried bitline, and wherein the plurality of pillars extend in a first direction; and
    forming a plurality of anchor trenches through the plurality of pillars and the STI, wherein the plurality of anchor trenches extend in a second direction, and wherein each anchor of the plurality of anchors is formed within a corresponding anchor trench of the plurality of anchor trenches.

3. The method of claim 2, wherein forming the plurality of pillars comprises:
    forming a plurality of pillar trenches through the epitaxial layer and through the buried bitline; and
    depositing an STI material within the plurality of pillar trenches.

4. The method of claim 2, further comprising:
    removing the capping layer;
    forming a gate device within each of the plurality of gate trenches; and
    forming the plurality of contacts in the upper portion of the plurality of pillars after forming the gate device within each of the plurality of gate trenches.

5. The method of claim 2, further comprising forming the plurality of anchors by: depositing a nitride layer within the plurality of anchor trenches; and
    depositing an oxide layer over the nitride layer.

6. The method of claim 1, further comprising forming the capping layer atop the upper surface of the plurality pillars and atop the plurality of anchors.

7. The method of claim 1, wherein etching the plurality of pillars to trim the lower portion of the plurality of pillars increases a first width of a lower section of each gate trench of the plurality of gate trenches.

8. The method of claim 7, wherein a second width of an upper section of each gate trench of the plurality of gate trenches is less than the first width of the lower section of each gate trench of the plurality of gate trenches.

9. The method of claim 1, further comprising forming an upper source/drain and a lower source/drain in each of the plurality of pillars.

10. A method of forming a $4F^2$ vertical dynamic random-access memory device, the method comprising:
    forming a hardmask over a plurality of pillars and over a plurality of anchors;
    etching through the hardmask to form a plurality of gate trenches and a plurality of vertical pillar structures;
    delivering a capping material to the plurality of vertical pillar structures at a non-zero angle relative to a perpendicular extending from an upper surface of the plurality of vertical pillar structures, wherein the capping material forms a capping layer along an upper portion of the plurality of vertical pillar structures without forming the capping layer along a lower portion of the plurality of vertical pillar structures;
    etching the plurality of vertical pillar structures to trim the lower portion of the plurality of vertical pillar structures; and
    forming a plurality of contacts in the upper portion of the plurality of vertical pillar structures.

11. The method of claim 10, further comprising:
    forming the plurality of pillars from an epitaxial layer, wherein the epitaxial layer is formed atop a buried bitline, and wherein the plurality of pillars extend in a first direction; and
    forming a plurality of anchor trenches through the plurality of pillars and through a shallow trench isolation, wherein the plurality of anchor trenches extend in a second direction, and wherein each anchor of the plurality of anchors is formed within a corresponding anchor trench of the plurality of anchor trenches.

12. The method of claim 11, wherein forming the plurality of pillars comprises:
    forming a plurality of pillar trenches through the epitaxial layer and through the buried bitline; and
    depositing a source trench isolation within the plurality of pillar trenches.

13. The method of claim 11, further comprising:
removing the capping layer;
forming a gate device within each of the plurality of gate trenches;
forming the plurality of contacts in the upper portion of the plurality of vertical pillar structures after forming the gate device within each of the plurality of gate trenches; and
forming an upper source/drain and a lower source/drain in each of the plurality of vertical pillar structures, wherein the plurality of contacts are positioned over the upper source/drain.

14. The method of claim 11, further comprising forming the plurality of anchors by: depositing a nitride layer within the plurality of anchor trenches; and
depositing an oxide layer over the nitride layer.

15. The method of claim 10, further comprising forming the capping layer atop the upper surface of the plurality vertical pillar structures and atop the plurality of anchors.

16. The method of claim 10, wherein etching the plurality of pillars to trim the lower portion of the plurality of pillars increases a first width of a lower section of each gate trench of the plurality of gate trenches, and wherein a second width of an upper section of each gate trench of the plurality of gate trenches is less than the first width of the lower section of each gate trench of the plurality of gate trenches.

* * * * *